(12) United States Patent
Maciolowski

(10) Patent No.: US 11,401,740 B2
(45) Date of Patent: Aug. 2, 2022

(54) COMPONENT CARRIER FOR ELECTRICAL/ELECTRONIC PARTS FOR ATTACHMENT IN A MOTOR VEHICLE DOOR LOCK

(71) Applicant: Kiekert AG, Heiligenhaus (DE)

(72) Inventor: Sascha Maciolowski, Hattingen (DE)

(73) Assignee: Kiekert AG, Heiligenhaus (DE)

( * ) Notice: Subject to any disclaimer, the term of this patent is extended or adjusted under 35 U.S.C. 154(b) by 712 days.

(21) Appl. No.: 16/330,787

(22) PCT Filed: Aug. 22, 2017

(86) PCT No.: PCT/DE2017/100702
§ 371 (c)(1),
(2) Date: Mar. 6, 2019

(87) PCT Pub. No.: WO2018/046051
PCT Pub. Date: Mar. 15, 2018

(65) Prior Publication Data
US 2019/0194984 A1    Jun. 27, 2019

(30) Foreign Application Priority Data

Sep. 6, 2016   (DE) .................. 10 2016 116 606.5

(51) Int. Cl.
*H05K 3/10* (2006.01)
*E05B 81/54* (2014.01)
(Continued)

(52) U.S. Cl.
CPC .............. *E05B 81/54* (2013.01); *E05B 81/06* (2013.01); *H05K 3/0014* (2013.01); *H05K 3/101* (2013.01);
(Continued)

(58) Field of Classification Search
CPC ...... H05K 3/101; H05K 3/0014; H05K 3/107; H05K 3/284; H05K 2201/09118; H05K 2203/1316
(Continued)

(56) References Cited

U.S. PATENT DOCUMENTS 6,521,830 B1 * 2/2003 Platz ...................... B29C 70/72
174/50
2007/0207644 A1 * 9/2007 Pollmann .......... B29C 45/14639
439/131

(Continued)

FOREIGN PATENT DOCUMENTS

DE          19944383 A1     4/2001
DE      102012010722 A1    12/2013
(Continued)

OTHER PUBLICATIONS

International Search Report and Written Opinion for corresponding Patent Application No. PCT/DE2017/100702 dated Dec. 7, 2017.

*Primary Examiner* — Sherman Ng
(74) *Attorney, Agent, or Firm* — Renner, Otto, Boisselle & Sklar, LLP

(57) ABSTRACT

A component carrier for electrical/electronic parts for attachment in a motor-vehicle door lock. Said component carrier is equipped with at least one carrier plate of plastic and with a metal conducting-track structure for electrically contacting the parts. According to the invention, the conducting-track structure and the carrier plate are produced in a combined plastic injection-molding and metal casting method.

18 Claims, 3 Drawing Sheets

Figure 1:
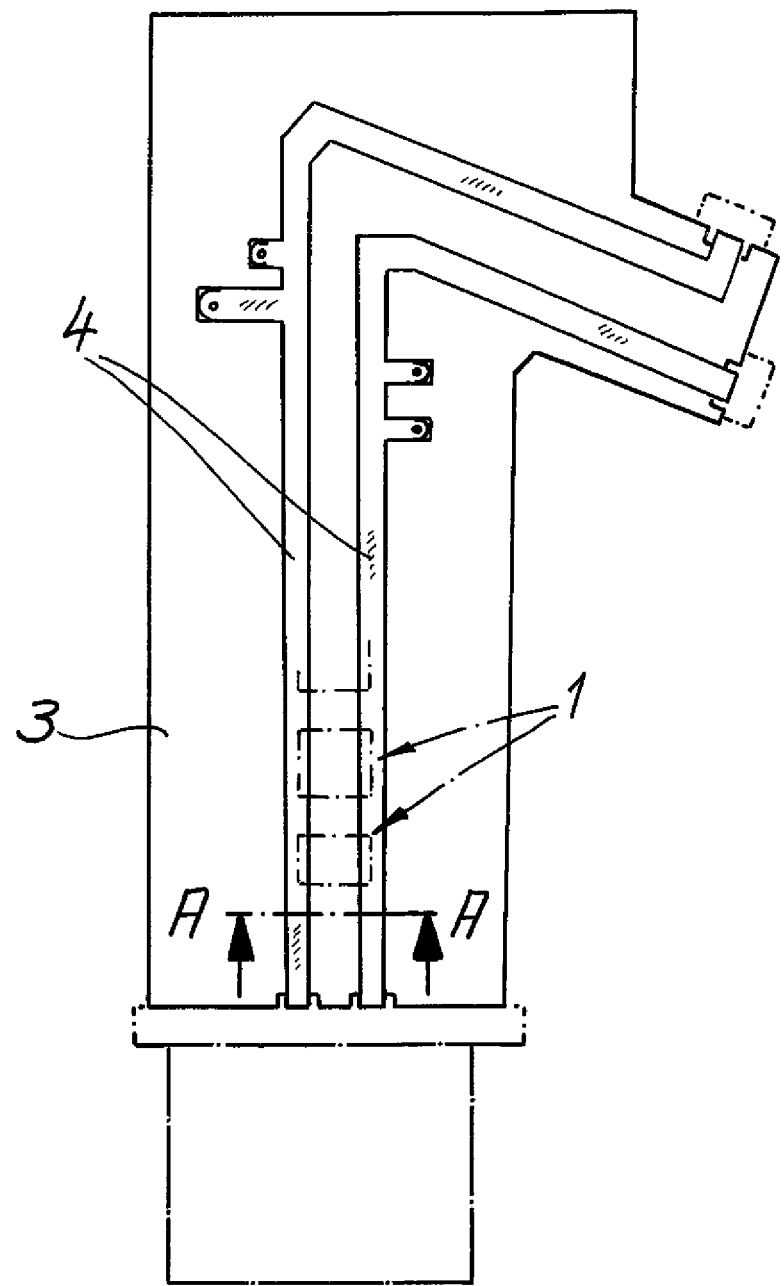

(51) Int. Cl.
*E05B 81/06* (2014.01)
*H05K 3/00* (2006.01)
*H05K 3/28* (2006.01)

(52) U.S. Cl.
CPC ............ *H05K 3/107* (2013.01); *H05K 3/284* (2013.01); *H05K 2201/09118* (2013.01); *H05K 2203/1316* (2013.01)

(58) Field of Classification Search
USPC .......................................................... 361/600
See application file for complete search history.

(56) References Cited

U.S. PATENT DOCUMENTS

| | | | | |
|---|---|---|---|---|
| 2007/0271849 | A1* | 11/2007 | Kriese | B60J 1/17 49/348 |
| 2015/0096338 | A1* | 4/2015 | Behnke | E05B 83/42 70/237 |
| 2015/0145327 | A1* | 5/2015 | Barmscheidt | E05B 85/02 307/10.2 |
| 2015/0155639 | A1* | 6/2015 | Weichsel | H01R 4/2483 439/426 |
| 2015/0240538 | A1* | 8/2015 | Mittelbach | E05B 85/243 292/195 |
| 2015/0368938 | A1* | 12/2015 | Erices | E05B 81/16 292/143 |
| 2016/0356066 | A1* | 12/2016 | Mazal | H05K 5/0217 |

FOREIGN PATENT DOCUMENTS

| | | |
|---|---|---|
| DE | 102014010628 A1 | 1/2016 |
| DE | 102014214134 A1 | 1/2016 |
| DE | 102015004896 A1 | 10/2016 |
| DE | 102016003325 A1 | 9/2017 |
| DE | 102016116606 A1 | 3/2018 |
| EP | 0051378 A2 | 5/1982 |
| WO | 2009117991 A1 | 10/2009 |
| WO | 2012000485 A2 | 1/2012 |

\* cited by examiner

COMPONENT CARRIER FOR ELECTRICAL/ELECTRONIC PARTS FOR ATTACHMENT IN A MOTOR VEHICLE DOOR LOCK

The invention relates to a component carrier for electrical/electronic parts for attachment in a motor-vehicle door lock. Said component carrier is equipped with at least one carrier plate of plastic and with a metal conducting-track structure for electrically contacting the parts.

Such component carriers are typically used and implemented in conjunction with motor vehicle door locks in order to realize in this way lock functions such as a central locking or an electric opening by, for example, a control of one or more electric motors. Also, the query of the position of individual elements in the interior of the motor vehicle door lock can be implemented in this way with a simple and easy installation process. Because the component carrier in question is generally electrically connected via one or more connecting sockets or generally interfaces with a central control unit inside of the associated motor vehicle.

In the production of the component carrier according to the type-specific state of the art WO 2009/117991 A1 one goes about it so that the carrier plate and the conductor structure are produced separately from one another. The conductor structure can be, for example, a stamped component, while the carrier plate is usually produced from plastic by injection molding.

The procedure of the state of the art of technology according to WO 2009/117991 A1 has basically proven itself, but still offers room for improvement. Because the separate production of the carrier plate and the conductor structure incurs increased costs.

The carrier plate is usually produced in a plastic injection mold. In contrast, for example, a punch is used for the production of the metallic conductor structure. As a result of this separate production, the conductor structure and the carrier plate must be transported separately and combined subsequently. Only then can the electrical/electronic components be electrically contacted with the conductor structure. This is expensive and error-prone. This is where the invention is used.

The invention is based on the technical problem of further developing such a component carrier so that the production costs are reduced. In addition, an associated method for producing such a component carrier is to be specified.

To solve this technical problem, a generic component carrier in the invention is characterized in that the conductor structure and the carrier plate are produced in a combined plastic injection and metal casting process.

For this purpose, the combined plastic injection and metal casting process used for the production of the component carrier generally uses a combined injection-molding tool, with the aid of which plastic for the carrier plate as well as liquid metal or a metal alloy for the realization of the conductor track structure can be processed. Such combined injection molding tools and thus plastic components with at least one electrical contact element, which are manufactured together, are known. Reference is made in this context to DE 10 2014 010 628 A1. However, hitherto use forms are not described in connection with a motor vehicle door lock.

In fact, such a component carrier for electrical/electronic components for mounting in a motor vehicle door lock is distinguished by a number of special features. For such a component carrier, it is thus not only important to have a mechanically stable design in order to take into account the many vehicle movements or vibrations but it is also of particular importance as well that the component carrier concerned is or may be exposed to changing temperatures and unfavorable environmental conditions. For this reason, according to an advantageous embodiment, the carrier plate including the conductor structure and with the electrical/electronic components mounted thereon are sealed by means of a potting compound.

The sealing with the potting compound ensures that on the one hand the therein embedded electrical/electronic components are protected from corrosion, dust, water, etc. and on the other hand any electrical connections between the components in question and the conductor structure cannot corrode as a result of sealing with the aid of the potting compound. This is what provides a functionally appropriate and durable structure in the first place.

The sealing with the aid of the potting compound or an electrically insulating material can be carried out such that the carrier plate including the conductor structure and the electrical/electronic components mounted thereon is inserted into a further injection mold and sealed with the aid of the electrically insulating potting compound. This may be a thermoplastic polymer and in particular polyethylene (PE). But it is also possible that the conductor structure with the electrical/electronic components mounted thereon is arranged and defined as a whole in a potting trough of the carrier plate, which is then in turn filled with the help of the flowable potting compound and sealed. Further details can be found by way of example in DE 10 2012 010 722 A1.

Due to the production according to the invention of the conductor structure together with the carrier plate in the combined plastic injection and metal casting process using the common injection mold, the carrier plate including printed circuit board structure is then immediately available for the assembly with the electrical/electronic components. At the end of this manufacturing process, the carrier plate, including the conductor structure and the electrical/electronic components mounted thereon, is then advantageously sealed with the aid of the potting compound. This can be done by the previously described filling of a potting trough or another injection mold. In any case, the manufacturing and system engineering effort is significantly reduced compared to the previous state of the art, so that special cost advantages for the inventive component carrier are observed. These are the fundamental advantages.

In detail, in the context of the combined plastic injection and metal casting process, it is possible to proceed by first producing the conductor structure in the metal casting method and then by injection molding the carrier plate onto the conductor structure. The metal casting process is in detail a metal die casting process or a metal injection molding process. As suitable metals, those with a low melting point, such as tin, have proved favorable, since these already exhibit the required flowability for processing in the metal casting process from temperatures of about 500° C. Iridium or iridium alloys are also conceivable.

As an alternative to the procedure already described above, it is also possible to proceed by first producing the carrier plate by means of an injection molding method and then overmolding or injecting the conductor structure onto or into the carrier plate. In both cases, the carrier plate is equipped with at least one recess and/or a cavity for receiving respective conductors of the conductor structure. The recess or the cavity serves as a receptacle or cavity for the metal for the realization of the conductor of the conductor structure.

The carrier plate is generally made of a thermoplastic polymer. Here, polymers such as polyethylene (PE), polyoxymethylene (POM), polyamide (PA), polymethyl methacrylate (PMMA) or polybutylene terephthalate (PBT) can be used.

The carrier plate produced in this manner together with the conductor structure and the electrical/electronic components is generally arranged and placed inside a lock housing of the motor vehicle door lock. The lock housing in question is made of plastic. In this case, comparable plastics can be used, as they are also used for the production of the carrier plate, i.e., also thermoplastic polymers. This even yields the possibility or optional for the carrier plate to form part of the plastic lock housing of the motor vehicle door lock. In this case, the carrier plate and the lock housing in question are produced wholly or partly in one go.

The production of the carrier plate including lock housing or as part of the lock housing is carried out again and according to the invention in combination with the previously described metal casting. As a result, a further reduction of the production cost is achieved because the separate production of the lock housing made of plastic in this case may be omitted completely or almost completely because it coincides at least partially with the production of the component carrier.

The invention is also concerned with a method for producing such a component carrier, as explained in more detail in claim 10. These are the fundamental advantages.

Figure 2:
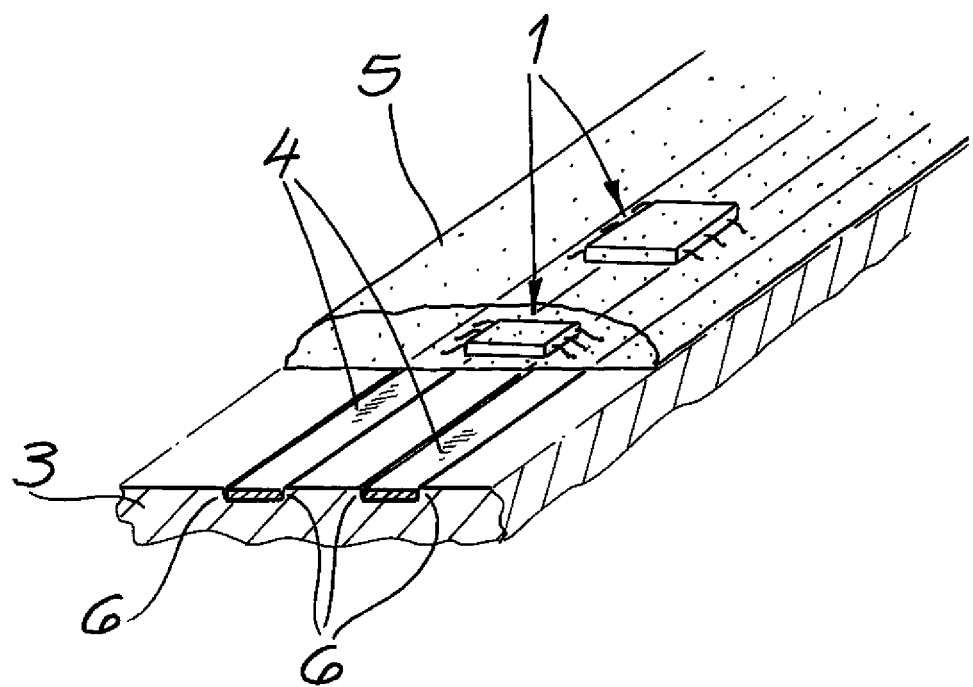
Figure 3:
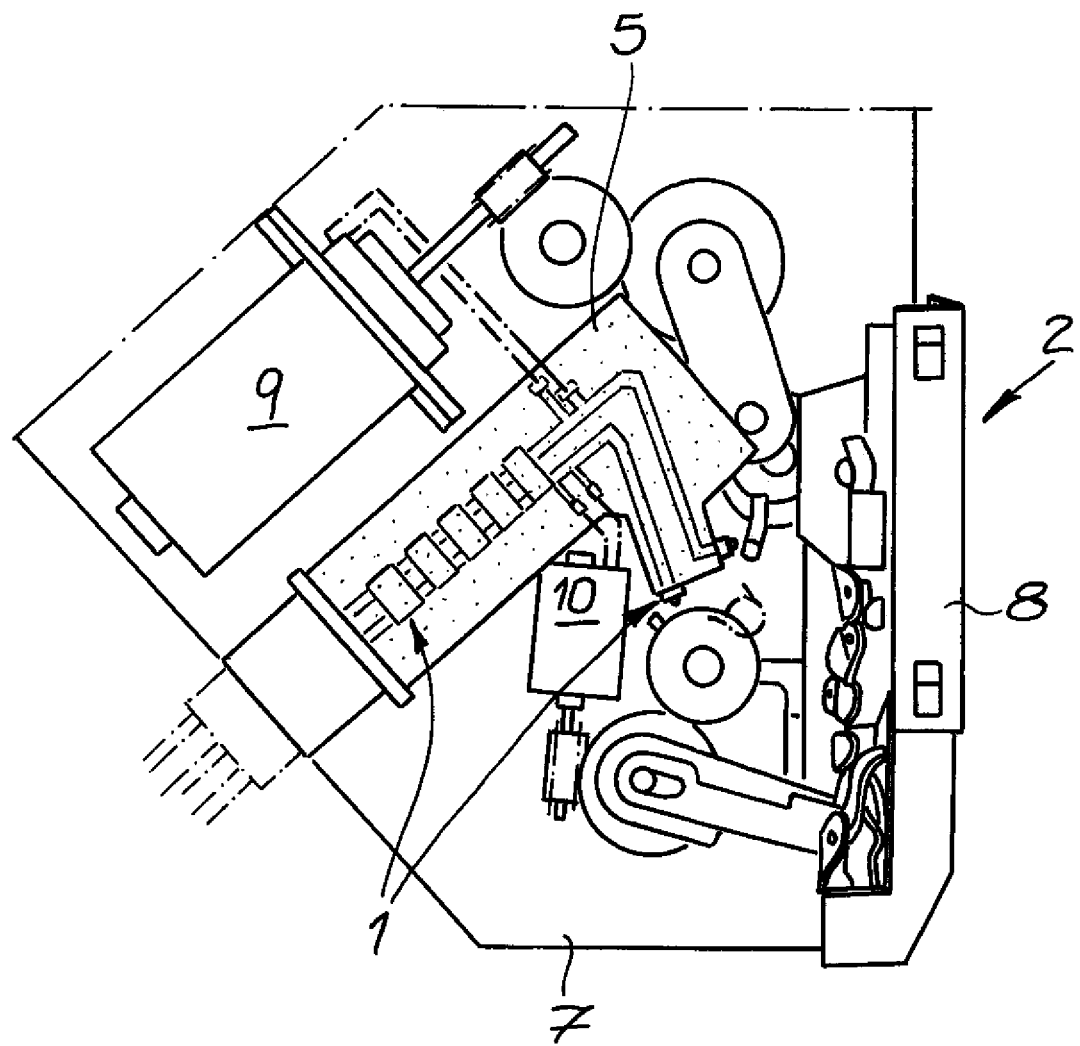

In the following the invention will be explained in more detail with reference to a drawing showing only one embodiment; the following applies:

FIG. 1 shows the component carrier according to the invention in a schematic view without applied electrical/electronic components FIG. 2 is a schematic section through the component carrier of FIG. 1 in the area A-A and FIG. 3 shows a vehicle door lock equipped with the component carrier described above in a perspective view.

In the figures, a component carrier for electrical/electronic components 1 is shown. The components in question 1 can be seen here primarily in FIG. 3, which shows the component carrier installed in a motor vehicle door lock 2. The electrical/electronic components 1 may be switches, sensors, electric motors, connecting sockets, or a control unit. With the help of this control unit or lock control unit, all functions of the motor vehicle door lock 2 can be mapped, such as a central locking, anti-theft device, child safety device, closing aid, an electric opening, etc. . . . . .

The component carrier in question for the electrical/electronic components 1 and its detailed structure are shown in FIGS. 1 and 2. Here, the depiction shows a carrier plate 3 made of plastic, which is equipped with a metallic conductor structure 4 for electrical connection of the electrical components 1, as will be explained in more detail below. The electrical/electronic components 1 are typically mounted and placed on the carrier plate 3 in contact with the conductor structure 4. For this purpose, SMD components (Surface Mounted Device) are usually used. After installation of the electrical/electronic components 1 on the carrier plate 3 or contacting with the conductor structure 4, said elements, i.e., the carrier plate 3, the conductor structure 4, and the electrical/electronic components 1 and optionally electrical connections, contacts, etc. are sealed with the help of a potting compound 5. As a result, the component carrier thus equipped is protected after its installation in the motor vehicle door lock 2 and during operation in an associated motor vehicle against any environmental influences, dust, moisture, etc.

The potting compound 5 in question can be seen only in the sectional view as per FIG. 2. In the exemplary embodiment, the potting compound is applied as a thermoplastic material in a flowable state on the carrier plate 3 with the metallic conductor structure 4 thereon including the electrical/electronic components 1, for example in an injection mold. But it is also possible that there is a potting trough at this point, which is not shown in the embodiment.

In the context of the invention, the procedure is now such that the conductor structure 2 and the carrier plate 3 are produced in a combined plastic injection and metal casting process. For this purpose, the invention uses a common injection mold, as has already been described in the introduction. According to the embodiment but not limited to the embodiment, the procedure is that first the conductor structure 4 is produced by the metal casting process. This may be a metal die casting process or a metal injection molding process. Subsequently, the carried plate 3 is overmolded onto the conductor structure 4 defined in this way. For this purpose, a suitable thermoplastic material such as polyethylene (PE) or polybutylene terephthalate (PBT) is used for the production of the carrier plate 3.

Alternatively, however, the carrier plate 3 can first be produced by means of the injection molding process and then the printed circuit board structure 4 is molded onto the carrier plate 3. In principle, the conductor structure 4 can also be injected into, for example, cavities of the carrier plate 3. As a rule, the carrier plate 3 is equipped with at least one depression between lateral walls 6. As a result, the conductor structure 4 or the individual conductors of the conductor structure 4 are fitted in the depression between the relevant walls 6. This applies to both conceivable production alternatives.

In the context of FIG. 3, it can now be seen that the carrier plate 3 is arranged together with the conductor structure 4 and the electrical/electronic components 1 mounted thereon in the interior of a housing 7 of a motor vehicle door lock 2. The motor vehicle door lock 2 has, in addition to the component carrier or the correspondingly equipped carrier plate on a lock case 8, which together with the indicated lock housing 7 provides for the enclosure of the illustrated components. While lock case 8 is metallic, lock case 7 is a plastic injection molded part.

In this case, there is the possibility that the carrier plate 3 and the respective lock housing 7 made of plastic are manufactured together as a whole or in part. In this case, the carrier plate 3 thus defines a part of the lock housing 7, which is not shown here, however.

Only for the sake of completeness it should be pointed out that the motor vehicle door lock 2 in question is equipped with two electric motors 9, 10. The electric motor 9 provides in this context for a closure aid, while the electric motor 10 is part of an anti-theft device or central locking system. Of course, this only serves as an example and is not restrictive.

The invention claimed is:

1. A component carrier for electrical/electronic components for mounting in a motor vehicle door lock, the component carrier comprising:
   at least one carrier plate made of plastic; and
   a metallic conductor structure for electrical contacting of the components, wherein the conductor structure and the carrier plate are formed in a combined plastic injection and metal casting process, wherein the carrier plate together with the conductor structure and the electrical/electronic components is arranged inside a lock housing made of plastic of the motor vehicle door lock.

2. The component carrier according to claim 1, wherein the metallic conductor structure is formed of a metal material that includes at least one of iridium, tin, or alloys thereof.

3. The component carrier according to claim 1, wherein the conductor structure is overmolded onto or into the carrier plate.

4. The component carrier according to claim 1, wherein the carrier plate has at least one recess between two walls and/or a cavity for receiving respective conductors of the conductor structure.

5. The component carrier according to claim 1 further comprising a potting compound seal that seals the carrier plate including the conductor structure the electrical/electronic components mounted thereon.

6. The component carrier according to claim 1, wherein the carrier plate is made of a thermoplastic polymer.

7. The component carrier according to claim 1, wherein the metallic conductor structure is a printed circuit board.

8. The component carrier according to claim 6, wherein the thermoplastic polymer is at least one of polyethylene (PE), polybutylene terephthalate (PBT), polyamide (PA), polyoxymethacrylate (POM), polymethylmethacrylate (PMMA).

9. The component carrier according to claim 1, wherein the carrier plate is formed integrally with the lock housing.

10. A method for producing a component carrier for electrical/electronic components for mounting in a motor vehicle door lock, the method comprising:
    forming at least one carrier plate of plastic and a metallic conductor structure for making electrical contact with the components using a combined plastic injection molding and metal casting process, and forming the carrier plate integrally with a plastic lock housing of the motor vehicle door lock.

11. The method according to claim 10 further comprising using a common injection mold for the combined plastic injection molding and metal casting process.

12. The method according to claim 10 further comprising:
    initially forming the conductor structure by a metal casting process; and
    injection-molding the carrier plate onto the formed conductor structure.

13. The method according to claim 12, wherein the metal casting process includes metal die casting.

14. The method according to claim 12, wherein the metal casting process includes metal injection molding.

15. The method according to claim 10 further comprising:
    initially forming the carrier plate by an injection molding process; and
    overmolding or injection-molding the conductor structure onto or into the formed carrier plate.

16. The method according to claim 10 further comprising sealing the carrier plate including the conductor structure and the electrical/electronic components mounted thereon by a potting compound.

17. The method according to claim 10 further comprising forming the carrier plate of a thermoplastic polymer material.

18. The method according to claim 10 further comprising forming the conductor structure of at least one of tin, iridium, or alloys thereof.

* * * * *